United States Patent
Trimberger

(10) Patent No.: US 6,720,793 B1
(45) Date of Patent: Apr. 13, 2004

(54) QUINTUPLE MODULAR REDUNDANCY FOR HIGH RELIABILITY CIRCUITS IMPLEMENTED IN PROGRAMMABLE LOGIC DEVICES

(75) Inventor: Stephen M. Trimberger, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 23 days.

(21) Appl. No.: 10/245,741

(22) Filed: Sep. 16, 2002

Related U.S. Application Data

(63) Continuation-in-part of application No. 10/150,044, filed on May 16, 2002, now Pat. No. 6,624,654.

(51) Int. Cl.[7] ................................................. G06F 7/38
(52) U.S. Cl. .............................. 326/9; 326/11; 326/14
(58) Field of Search ................................ 326/9, 10, 11, 326/14, 15; 716/6, 16, 18

(56) References Cited

U.S. PATENT DOCUMENTS

| | | |
|---|---|---|
| 4,695,740 A | 9/1987 | Carter |
| 4,713,557 A | 12/1987 | Carter |
| 4,835,418 A | 5/1989 | Hsieh |
| 5,031,180 A | 7/1991 | McIver et al. |
| RE34,363 E | 8/1993 | Freeman |
| 5,517,135 A | 5/1996 | Young |
| 5,925,920 A | 7/1999 | MacArthur et al. |
| 6,104,211 A | 8/2000 | Alfke |
| 6,526,559 B2 | 2/2003 | Schiefele et al. |

OTHER PUBLICATIONS

Seong Woo Kwak and Byung Kook Kim, "Task–Scheduling Strategies for Reliable TMR Controllers Using Task Grouping and Assignment"; IEEE Transactions on Reliability, vol. 49, No. 4; Dec. 2000; pp. 355–362.

*Primary Examiner*—Anh Tran
(74) *Attorney, Agent, or Firm*—Lois D. Cartier

(57) ABSTRACT

Structures and methods for generating high reliability designs for PLDs on which single event upsets have minimal impact. When standard triple modular redundancy (TMR) methods are used in PLDS, a single event upset can short together two module output signals and render two of the three voting circuit input signals invalid. The invention addresses this issue by providing quintuple modular redundancy (QMR) for high-reliability circuits implemented in PLDs. Thus, a single event upset that inadvertently shorts together two PLD interconnect lines can render invalid only two out of five module output signals. The majority of the five modules still provide the correct value, and the voting circuit is able to correctly resolve the error. In some embodiments, a user selects a high-reliability circuit implementation option and/or a PLD particularly suited to a QMR implementation, and the PLD implementation software automatically implements the QMR structure for the user circuit.

24 Claims, 4 Drawing Sheets

QUINTUPLE MODULAR REDUNDANCY FOR HIGH RELIABILITY CIRCUITS IMPLEMENTED IN PROGRAMMABLE LOGIC DEVICES

This application is a continuation-in-part of Ser. No. 10/150,044, now U.S. Pat. No. 6,624,654 filed May, 16, 2002.

FIELD OF THE INVENTION

The invention relates to programmable logic devices (PLDs) subject to single event upsets. More particularly, the invention relates to structures and methods of generating high reliability designs for PLDs on which single event upsets have minimal impact.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The various logic blocks are interconnected by a programmable interconnect structure that includes a large number of programmable interconnect lines (e.g., metal wires). The interconnect lines and logic blocks are interconnected using programmable interconnect points (PIPs). A PIP can be, for example, a CMOS passgate. When the passgate is turned on (i.e., the PIP is enabled), the two nodes on either side of the passgate are electrically connected. When the passgate is turned off (i.e., the PIP is disabled), the two nodes are isolated from each other. Thus, by controlling the values on the gate terminals of the PIPs, circuit connections can be easily made and altered.

PIPs can be implemented in many different ways. For example, a buffered PIP can be implemented as a tristate buffer. When the tristate signal is low, the buffer output is not driven, and the two nodes on either side of the buffer are isolated. When the tristate signal is high, one of the nodes drives the other node in a unidirectional connection.

Various exemplary types of PIPs are described by Freeman in U.S. Pat. No. Re. 34,363, by Carter in U.S. Pat. Nos. 4,695,740 and 4,713,557, by Hsieh in U.S. Pat. No. 4,835,418, and by Young in U.S. Pat. No. 5,517,135, all of which are hereby incorporated by reference. Some PIPs are unidirectional and some are bidirectional. Some are buffered and some are not buffered. However, the various types of PIPs typically have this in common, that they are controlled by a single data value stored in a memory cell called a configuration memory cell.

The logic blocks and PIPs in a PLD are typically programmed (configured) by loading configuration data into thousands of configuration memory cells that define how the CLBs, IOBs, and interconnect lines are configured and interconnected. In Field Programmable Gate Arrays (FPGAs), for example, each configuration memory cell is implemented as a static RAM cell.

When subjected to unusual conditions such as cosmic rays or bombardment by neutrons or alpha particles, a static RAM cell can change state. For example, a stored high value can be inadvertently changed to a low value, and vice versa. Sometimes these "single event upsets" have no effect on the functionality of the chip. At other times, a single event upset can change the function of a PLD such that the circuit no longer functions properly.

FIG. 1 shows a portion of a PLD that includes three logic blocks LB1–LB3, five interconnect lines IL0–IL4, and four PIPs P1–P4. Interconnect lines IL1–IL3 are coupled to logic blocks LB1–LB3, respectively. For simplicity, interconnect lines IL1–IL3 are shown directly connected to the corresponding logic blocks. In practice, the interconnect lines do not necessarily connect directly to the logic blocks, but can pass through additional PIPs to reach the logic blocks. Interconnect lines IL1–IL3 can each be programmably coupled to interconnect line IL0 through PIPs P1–P3, respectively. Interconnect line IL4 can be programmably coupled to interconnect line IL3 through PIP P4.

PIPs P1–P4 are respectively controlled by four memory cells MC1–MC4. When the value stored in one of the memory cells is high, the passgate in the associated PIP is enabled. When the value stored in one of the memory cells is low, the interconnect lines on either side of the associated PIP are not connected together. They can be left unconnected or wired as parts of two separate circuits.

As an example, consider the case where memory cells MC1, MC2, and MC4 each store a high value and memory cell MC3 stores a low value. PIPs P1 and P2 are enabled, connecting together interconnect lines IL1, IL0, and IL2. PIP P4 is also enabled, connecting together interconnect lines IL3 and IL4. PIP P3 is disabled. Further consider that logic block LB1 is driving a signal on interconnect line IL1 and logic block LB3 is driving a signal on interconnect line IL3. For example, PIPs P1 and P3 can be included in output drivers of the CLBs including logic blocks LB1 and LB3, respectively. PIPs P1–P4 can also form part of multiplexer structures within logic blocks or CLBs, or within the programmable interconnect structure of the PLD.

Now suppose a single event upset occurs at memory cell MC1, and the value stored in memory cell MC1 changes from a high value to a low value. PIP P1 is inadvertently disabled, and interconnect line IL1 is isolated from interconnect line IL0. If logic block LB1 was driving logic block LB2 through interconnect line IL0, for example, the connection no longer exists, and the circuit does not function properly.

Suppose instead that a single event upset occurs at memory cell MC3 and the value stored in memory cell MC3 changes from a low value to a high value. PIP P3 is inadvertently enabled. Logic block LB3 tries to place a value on interconnect line IL0, which is already driven by logic block LB1. Contention occurs, which can cause a number of problems ranging from excessive current consumption to a malfunctioning circuit to causing actual damage to the PLD.

Circuits and methods have been developed to avoid the problems associated with single event upsets in non-programmable circuits. One strategy for avoiding such problems is illustrated in FIG. 2. The illustrated circuit is called a triple modular redundancy (TMR) circuit. In essence, the required logic is implemented three times (i.e., in three modules), and the results generated by the three modules are compared. The two that are the same are considered to be correct, and the "dissenting vote" is thrown out.

The TMR circuit of FIG. 2 includes modules M1–M3, representing three implementations of the same logical function. Each module has a respective output signal O1–O3 that drives voting circuit VC3. Voting circuit VC3 implements the function (O1 AND O2) OR (O2 AND O3) OR (O1 AND O3) and provides the result as the output signal OUT of the circuit.

Clearly, this approach overcomes any single event upset that affects the functionality of one of the three modules M1–M3. The module affected by the event produces an incorrect answer, which is overridden in the voting circuit by the other two modules.

Kwak and Kim extend the TMR concept to embrace time-multiplexed modular redundancy in "Task-Scheduling Strategies for Reliable TMR Controllers Using Task Grouping and Assignment", published in the December 2000 issue of IEEE Transactions on Reliability, Vol. 49, No. 4, pages 355–362, which pages are hereby incorporated by reference. Kwak and Kim address the effects of transient errors, rather than permanent errors such as those caused in PLDs by single event upsets. When addressing transient errors, sequentially recalculating a module output, even using the same module, can give different results that can then be resolved by the voting circuit.

In Kwak and Kim's approach, three modules are included in the circuit, but module output values are calculated five times (TMR-Q) using timing rotation in the three modules. A voting circuit determines the "majority vote" for the module output values. Additional calculations can be performed, i.e., N calculations where N is an odd number greater than five (TMR-N).

All of the above methods (TMR, TMR-Q, and TMR-N) address the issue of permanent or transient errors that cause malfunctions within the modules. However, PLDs present some special issues with regard to single event upsets, because single event upsets can occur not only within the modules, but within the programmable routing that interconnects the modules and the voting circuit. For example, referring to FIG. 2, a single event upset that changes the value stored in a PIP memory cell can short together two of the module output signals 01–03. In this event, two of the three inputs to the voting circuit can be incorrect.

Further, circuits implemented in a PLD are not necessarily implemented in discrete regions of the device. The best implementation of the circuit of FIG. 2 in terms of performance or minimizing resource usage might be to physically intermix the logic for the three modules M1–M3. In that case, internal nodes in two different modules can easily be separated by only a single disabled PIP. If a single event upset inadvertently enables such a PIP, internal nodes from the two modules are shorted together. Again, two of three modules are providing suspect data to the voting circuit.

Similarly, single event upsets can cause inadvertent connections between a node in one of the modules and a node in the voting circuit, or between two different nodes in a voting circuit, or between nodes in two different voting circuits.

Therefore, it is desirable to provide structures and methods for implementing circuits in PLDs that offer protection from the effects of single event upsets.

SUMMARY OF THE INVENTION

The invention provides structures and methods for generating high reliability designs for PLDs on which single event upsets have minimal impact. The structures and methods of the invention address the special issues faced by PLD designers when designing high-reliability circuits, specifically the fact that when standard triple modular redundancy (TMR) is used, a single event upset can short together two module output signals and render two of the three voting circuit input signals invalid. Thus, the advantage provided by the standard TMR circuit is significantly reduced by the programmable nature of the PLD routing.

The invention addresses this issue by providing five modules (quintuple modular redundancy, or QMR) rather than three modules for high-reliability circuits implemented in PLDS. Thus, a single event upset that inadvertently shorts together two PLD interconnect lines can render invalid only two out of five module output signals. The majority of the five modules still provide the correct value, and the voting circuit is able to correctly resolve the error.

According to a first aspect of the invention, a user circuit is implemented in a PLD, where the PLD includes programmable logic blocks, programmable interconnect lines, and programmable interconnect points (PIPs) interconnecting the logic blocks and interconnect lines. A structure implementing the user circuit includes five copies of the user circuit implemented using the logic blocks, interconnect lines, and PIPs; a voting circuit that provides a value common to at least three input terminals at a voting circuit output terminal; and programmable interconnections coupling output terminals of the five copies of the user circuit to corresponding input terminals of the voting circuit via the interconnect lines and PIPs.

According to another aspect of the invention, a method of implementing a user circuit in a PLD includes receiving a circuit description of the user circuit; implementing five copies of the user circuit based on the circuit description and using logic blocks, interconnect lines, and PIPs of the PLD; implementing a voting circuit that provides a value common to at least three input terminals at a voting circuit output terminal; and implementing interconnections between the output terminals of the five copies of the user circuit and corresponding input terminals of the voting circuit via the interconnect lines and PIPs.

In some embodiments, a user selects a high-reliability circuit implementation option, and the PLD implementation software automatically implements the QMR structure. Some PLD software can target multiple PLD architectures, e.g., PLDs controlled by antifuses and PLDs controlled by static RAM memory cells. In some embodiments, such multi-targeting software selects either a TMR or a QMR implementation for the user circuit, depending on characteristics of the target PLD. For example, if the target PLD is controlled by static RAM memory cells, a TMR implementation does not necessarily protect against a single event upset in the programmable routing. Thus, the QMR implementation is automatically selected for the target PLD. However, if the target PLD is antifuse based, a TMR implementation is selected.

Another aspect of the invention provides a method of implementing a user circuit in a PLD, including providing a circuit description of the user circuit, and receiving a PLD implementation for the circuit. The PLD implementation includes five copies of the user circuit implemented using logic blocks, interconnect lines, and PIPs of the PLD; a voting circuit that provides a value common to at least three input terminals at a voting circuit output terminal; and programmable interconnections coupling output terminals of the five copies of the user circuit to corresponding input terminals of the voting circuit via the interconnect lines and PIPs. Some embodiments include providing an indicator selecting a high-reliability QMR implementation for the user circuit. Some embodiments include providing a target selection indicator, on the basis of which a QMR implementation is selected.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial when applied to PLDs in which programmable routing is controlled by configuration data stored in static RAM memory cells subject to single event upsets. While the present invention is not so limited, an appreciation of the present invention is presented by way of specific examples directed to such PLDs.

Figure 1:
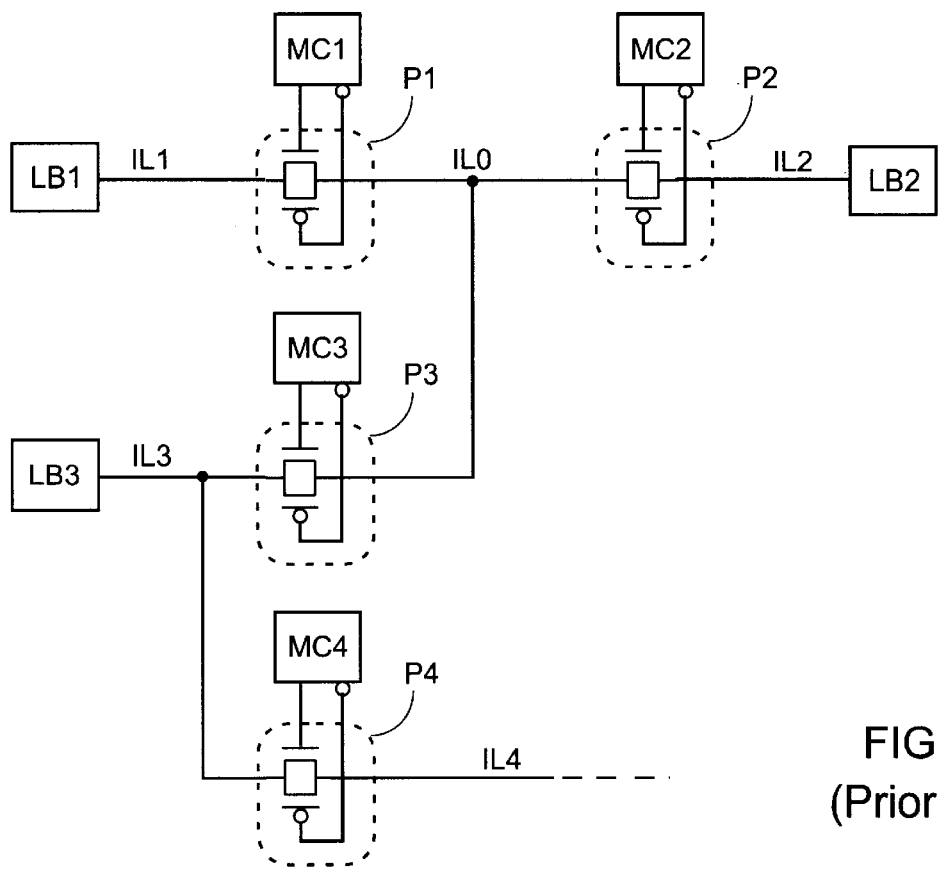
FIG. 1 shows an exemplary structure in a programmable logic device (PLD).
Figure 2:
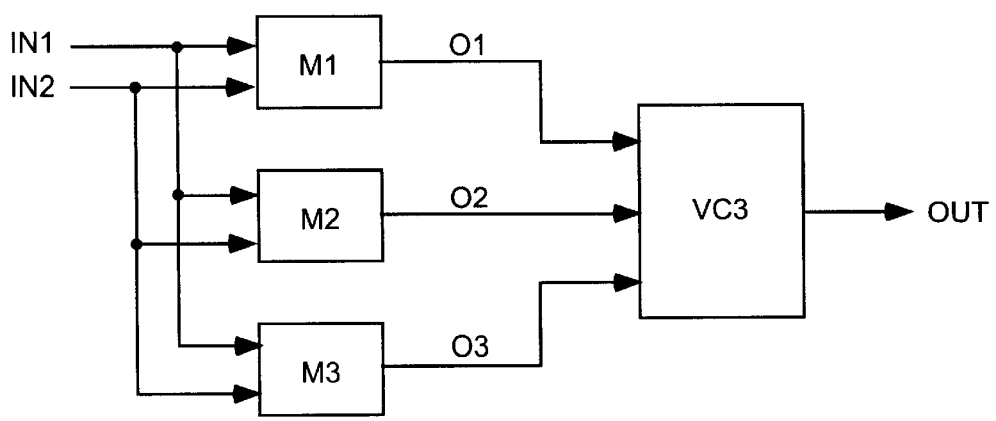
FIG. 2 shows a well-known triple modular redundancy (TMR) circuit.
Figure 3:
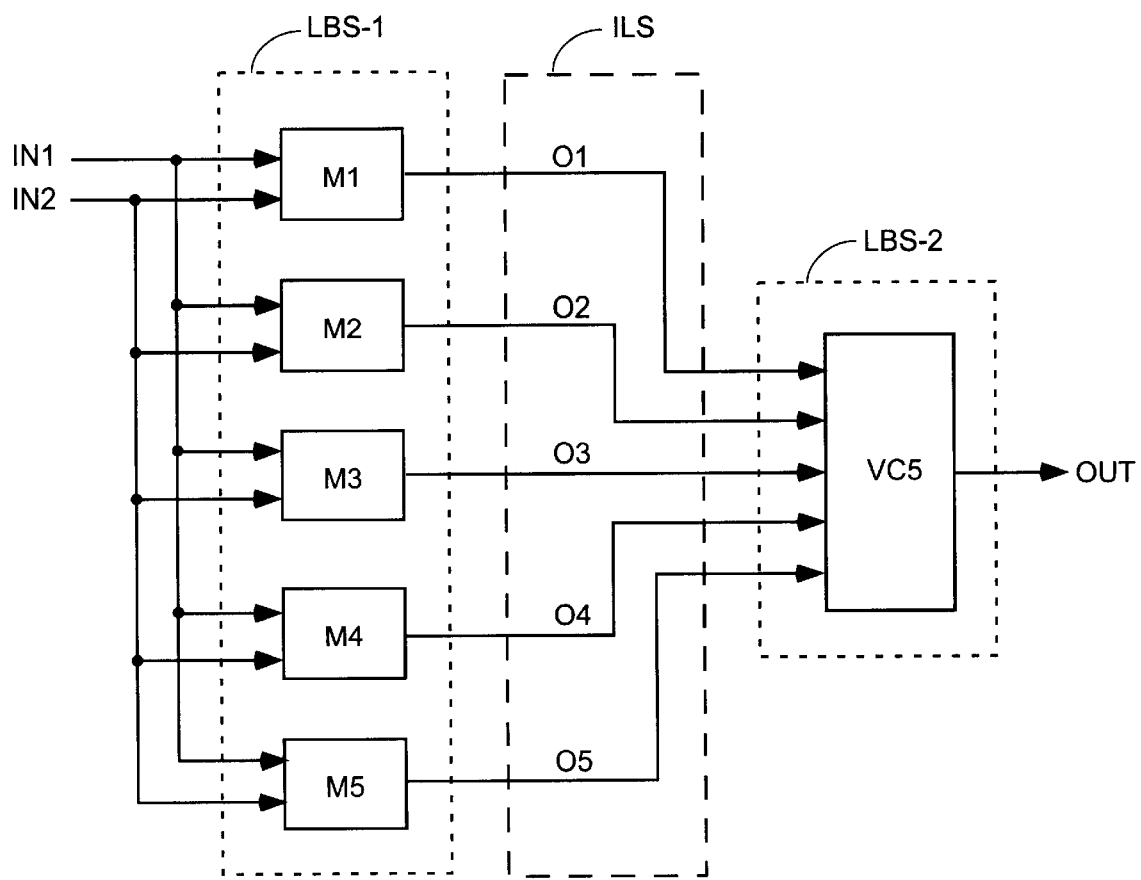
FIG. 3 shows a structure implementing a user circuit in a PLD using a quintuple modular redundancy (QMR) approach.

FIG. 3 shows a structure that implements a user circuit in a PLD using a quintuple modular redundancy (QMR) approach. Five copies M1–M5 of a user circuit are implemented in logic blocks, interconnect lines, and programmable interconnect points (PIPs) LBS-1 of the PLD. Likewise, a voting circuit VC5 is implemented in logic blocks, interconnect lines, and programmable interconnect points (PIPs) LBS-2 of the PLD. Interconnecting the copies of the user circuit with the voting circuit are programmable interconnections implemented using interconnect lines and PIPs ILS of the PLD.

Voting circuit VC5 allows any three copies of the user circuit providing the same answer to override any answer from the other two copies. Specifically, voting circuit VC5 implements the function (O1 AND O2 AND O3) OR (O1 AND O2 AND O4) OR (O1 AND O2 AND O5) OR (O1 AND O3 AND O4) OR (O1 AND O3 AND O5) OR (O1 AND O4 AND O5) OR (O2 AND O3 AND O4) OR (O2 AND O3 AND O5) OR (O2 AND O4 AND O5) OR (O3 AND O4 AND O5).

In other embodiments (not shown), additional copies of the user circuit are included, e.g., an additional two copies, four copies, and so forth. In each embodiment, the voting circuit performs a "majority rules" calculation to determine the final output value. However, five copies of the user circuit are sufficient to overcome the special circumstances associated with PLDs, i.e., the possibility of an error caused by a single event upset in the programmable routing structure.

As an additional advantage, the QMR approach overcomes any two independent single event upsets that affect the internal functionality of two of the five copies M1–M5.

Figure 4:
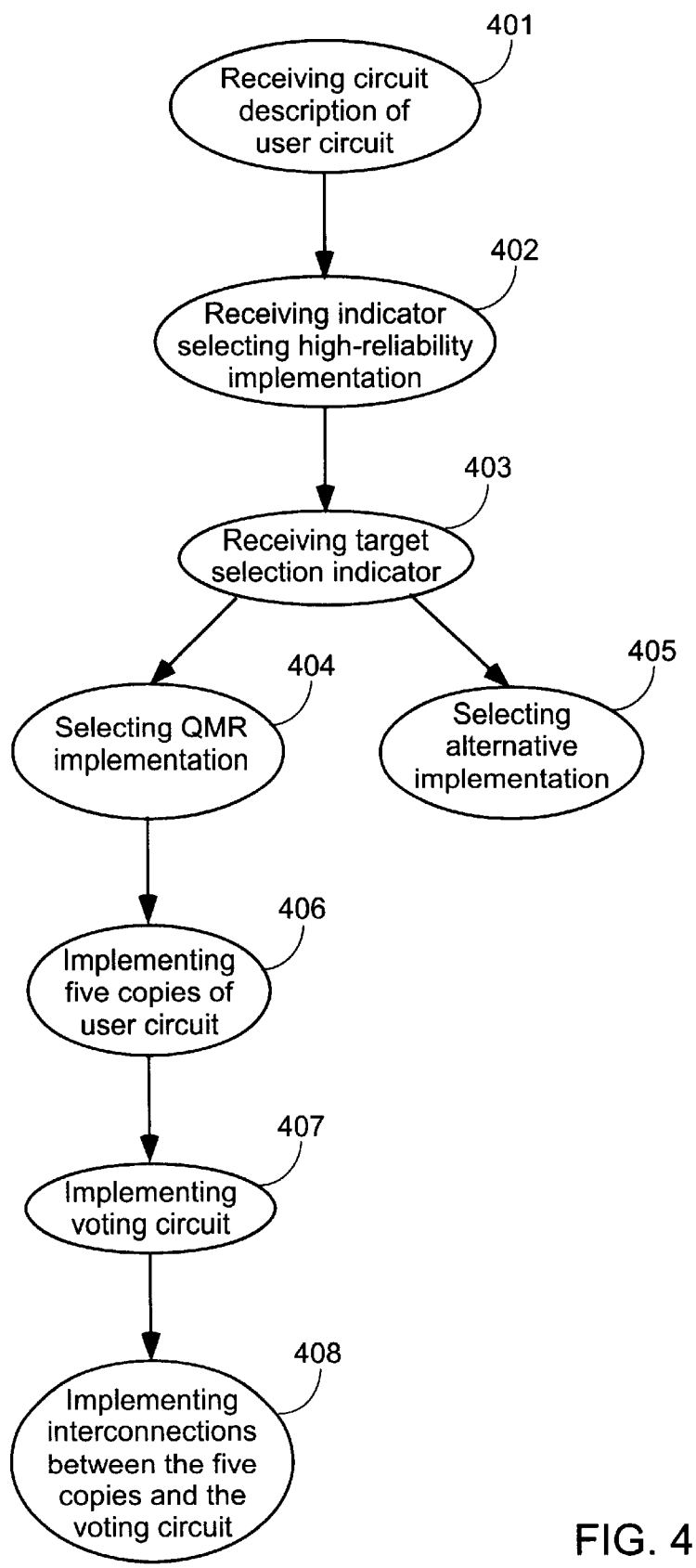
FIG. 4 shows a first method of implementing a user circuit in a PLD using a QMR approach.

FIG. 4 illustrates the steps of a first exemplary method of implementing a user circuit in a PLD using a QMR approach.

In step 401, a circuit description of the user circuit is received. The circuit description can include only the user circuit, or can describe a larger circuit of which the user circuit constitutes a portion. The circuit description can be in the form of a netlist, for example. A netlist is a listing that includes all the components of a circuit and the connections between the components. A netlist describes the circuit in terms of its components rather than as a particular implementation, e.g., a PLD implementation. As another example, the circuit description can be in the form of an already-implemented design. For example, the circuit description can specify the PLD logic blocks, their relative locations, and the interconnect lines and/or PIPs to be used to interconnect the PLD logic blocks.

In step 402, an indicator is received that selects a high-reliability implementation for the user circuit. In some embodiments, this step is omitted and a high-reliability implementation is always used.

In step 403, a target selection indicator is received, e.g., specifying a particular PLD, type of PLD, or PLD architecture in which the user circuit is to be implemented. In some embodiments, this step is omitted and the PLD implementation software uses a default target PLD or selects a target PLD based on various factors such as the size of the user circuit or a larger design including the user circuit.

Clearly, steps 401–403 need not occur in the order shown, but can occur in any order, or simultaneously.

In step 404, a QMR approach is selected. The selection can be made, for example, based on the status of the high-reliability indicator (i.e., if high-reliability is selected, QMR is used) or based on the target selection indicator. For example, QMR might be selected only if the target PLD is static RAM-based. The QMR approach might also be selected for a design or part of a design implemented in a RAM-based FPGA where the implementation software cannot separate the modules of a TMR implementation so as to eliminate the possibility of a single event upset causing two modules to fail. For example, QMR might be selected when space, timing issues, or the local pattern of routing connections make it impossible to separate modules in a TMR implementation by more than a single PIP from all signals of the other two modules.

Step 405 provides an alternative path in which another implementation (e.g., TMR) is selected. This path might be selected, for example, if the target PLD is an antifuse-based device. In some embodiments, no alternative implementation is provided, and a QMR implementation is always selected.

In step 406, five copies of the user circuit are implemented. The copies can be implemented in five distinct areas of the PLD, or the copies can overlap (e.g., two copies, or portions thereof, can be implemented using the same logic block or in overlapping areas of the PLD). Further, the copies can be implemented in the same way, i.e., using the same number of logic blocks, interconnect lines, and PIPS, positioned in the same locations relative to the other logic blocks, interconnect lines, and PIPs within the same copy. This similarity is likely to result, for example, when the circuit description is provided in a format that includes this PLD implementation information, as described above. Alternatively, the copies can be implemented in different ways, as is likely to result when PLD implementation information is not included in the circuit description, e.g., the circuit description is in netlist format.

In some embodiments (not shown), additional copies (e.g., two additional copies) of the user circuit are implemented.

In step 407, a voting circuit is implemented that provides a value common to at least three of the voting circuit input terminals at the voting circuit output terminal. When two additional copies are included, for example, for a total of seven copies, the voting circuit provides a value common to at least four of the voting circuit input terminals.

In step 408, interconnections are implemented between output terminals of the copies and the input terminals of the voting circuit. In some embodiments, where the PLD is a field programmable array (FPGA), the interconnections are programmed by configuration data stored in static RAM memory cells subject to single event upsets. By using the QMR approach detailed herein, a single event upset can invalidate output signals from two of the five copies of the user circuit, but the other three copies are not affected. Therefore, a single event upset is overcome when the structures and methods of the invention are used.

Clearly, steps 406–408 need not occur in the order shown, but can occur in any order, or simultaneously.

Figure 5:
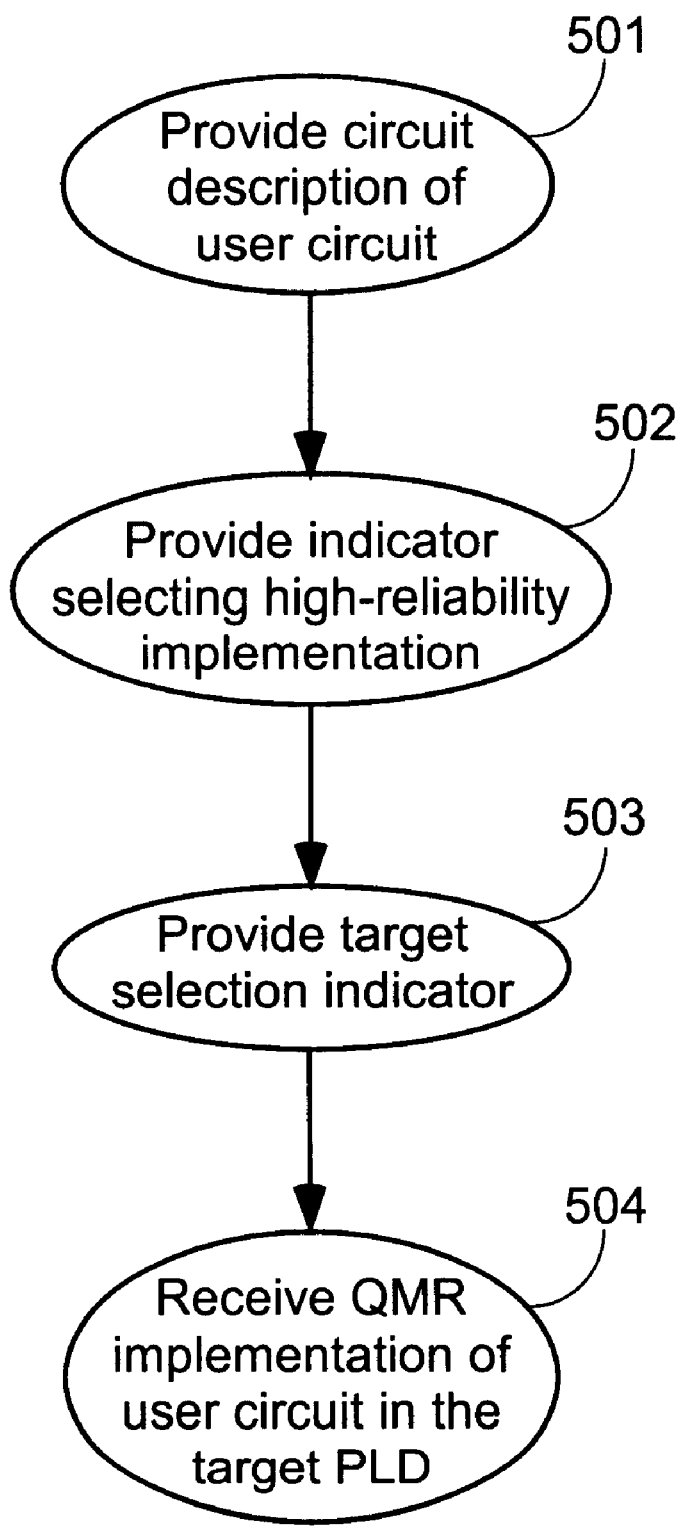
FIG. 5 shows a second method of implementing a user circuit in a PLD using a QMR approach.

FIG. 5 illustrates the steps of a second exemplary method of implementing a user circuit in a PLD using a QMR approach.

In step 501, a circuit description of the user circuit is provided, e.g., to a PLD implementation software package. The circuit description can include only the user circuit, or can describe a larger circuit of which the user circuit constitutes a portion. The circuit description can be in the form of a netlist or a PLD implementation, for example, as described above.

In step 502, an indicator is provided that selects a high-reliability implementation for the user circuit. In some embodiments, this step is omitted and a high-reliability implementation is always assumed.

In step 503, a target selection indicator is provided, e.g., to the PLD implementation software. In some embodiments, this step is omitted and the PLD implementation software uses a default target PLD or selects a target PLD based on various factors such as the size of the user circuit or a larger design including the user circuit.

Clearly, steps 501–503 need not occur in the order shown, but can occur in any order, or simultaneously.

In step 504, a QMR implementation of the user circuit in the target PLD is received, e.g., from the PLD implementation software. The QMR implementation includes five copies of the user circuit (or more, as described above), a voting circuit, and programmable interconnections between the copies of the user circuit and the voting circuit, as described above.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform.

Those having skill in the relevant arts of the invention will now perceive various modifications and additions that can be made as a result of the disclosure herein. For example, the above text describes the circuits and methods of the invention in the context of PLDs such as field programmable gate arrays (FPGAs). However, the methods of the invention can also be implemented in other PLDs subject to the effects of single event upsets or other kinds of failures such as hot electron trapping in nonvolatile memories, for example, in CPLDs containing flash memories.

Accordingly, all such modifications and additions are deemed to be within the scope of the invention, which is to be limited only by the appended claims and their equivalents.

What is claimed is:

1. A structure implementing a user circuit in a programmable logic device (PLD), the PLD including programmable logic blocks, programmable interconnect lines, and programmable interconnect points (PIPs) interconnecting the logic blocks and interconnect lines, the structure comprising:

five copies of the user circuit implemented using the logic blocks, interconnect lines, and PIPs, each copy having an output terminal;

a voting circuit having an output terminal and five input terminals, wherein the voting circuit provides a value common to at least three of the voting circuit input terminals at the voting circuit output terminal; and programmable interconnections coupling the output terminals of the five copies of the user circuit to the five input terminals of the voting circuit via the interconnect lines and PIPs.

2. The structure of claim 1, wherein the five copies of the user circuit are implemented in five distinct areas of the PLD.

3. The structure of claim 1, wherein at least two of the five copies of the user circuit physically overlap within the PLD.

4. The structure of claim 1, wherein the five copies of the user circuit are each implemented using the same number of logic blocks, interconnect lines, and PIPs, positioned in the same locations relative to the other logic blocks, interconnect lines, and PIPs within the same copy.

5. The structure of claim 1, further comprising two additional copies of the user circuit implemented using the logic blocks, interconnect lines, and PIPs, each additional copy having an output terminal, and wherein:

the voting circuit has two additional input terminals coupled to the output terminals of the two additional copies of the user circuit via the interconnect lines and PIPs, and the voting circuit provides a value common to at least four of the voting circuit input terminals at the voting circuit output terminal.

6. The structure of claim 1, wherein the PLD is a field programmable gate array (FPGA) programmed by configuration data stored in static RAM memory cells.

7. A method of implementing a user circuit in a programmable logic device (PLD), the PLD including programmable logic blocks, programmable interconnect lines, and programmable interconnect points (PIPs) interconnecting the logic blocks and interconnect lines, the method comprising:

receiving a circuit description of the user circuit;

implementing five copies of the user circuit based on the circuit description and using the logic blocks, interconnect lines, and PIPs, each copy having an output terminal;

implementing a voting circuit having an output terminal and five input terminals, wherein the voting circuit provides a value common to at least three of the voting circuit input terminals at the voting circuit output terminal; and implementing interconnections between the output terminals of the five copies of the user circuit and the input terminals of the voting circuit via the interconnect lines and PIPs.

8. The method of claim 7, wherein implementing five copies of the user circuit comprises implementing five copies of the user circuit in five distinct areas of the PLD.

9. The method of claim 7, wherein implementing five copies of the user circuit comprises implementing five copies of the user circuit wherein at least two copies of the user circuit physically overlap within the PLD.

10. The method of claim 7, wherein implementing five copies of the user circuit comprises implementing five copies of the user circuit using the same number of logic blocks, interconnect lines, and PIPs, positioned in the same locations relative to the other logic blocks, interconnect lines, and PIPs within the same copy.

11. The method of claim 7, wherein:
implementing a voting circuit comprises implementing a voting circuit having seven input terminals including the five input terminals and two additional input terminals, and
the voting circuit provides a value common to at least four of the voting circuit input terminals at the voting circuit output terminal,
the method further comprising:
implementing two additional copies of the user circuit using the logic blocks, interconnect lines, and PIPs, each additional copy having an output terminal; and
implementing interconnections between the output terminals of the two additional copies of the user circuit and the two additional input terminals of the voting circuit via the interconnect lines and PIPs.

12. The method of claim 7, wherein the PLD is a field programmable gate array (FPGA) programmed by configuration data stored in static RAM memory cells.

13. The method of claim 7, further comprising:
receiving from a user an indicator selecting a high-reliability implementation of the user circuit; and
selecting a quintuple modular redundancy implementation for the user circuit based on the indicator.

14. The method of claim 7, further comprising:
receiving from a user a target selection indicator selecting a target PLD; and
selecting a quintuple modular redundancy implementation for the user circuit based on the target selection indicator.

15. The method of claim 14, wherein the target PLD is a field programmable gate array (FPGA) programmed by configuration data stored in static RAM memory cells.

16. A method of implementing a user circuit in a programmable logic device (PLD), the PLD including programmable logic blocks, programmable interconnect lines, and programmable interconnect points (PIPs) interconnecting the logic blocks and interconnect lines, the method comprising:

providing a circuit description of the user circuit; and
receiving a PLD implementation for the circuit, the PLD implementation comprising:
five copies of the user circuit implemented using the logic blocks, interconnect lines, and PIPs, each copy having an output terminal;
a voting circuit having an output terminal and five input terminals, wherein the voting circuit provides a value common to at least three of the voting circuit input terminals at the voting circuit output terminal; and
programmable interconnections coupling the output terminals of the five copies of the user circuit to the five input terminals of the voting circuit via the interconnect lines and PIPs.

17. The method of claim 16, wherein the five copies of the user circuit are implemented in five distinct areas of the PLD.

18. The method of claim 16, wherein at least two of the five copies of the user circuit physically overlap within the PLD.

19. The method of claim 16, wherein the five copies of the user circuit are each implemented using the same number of logic blocks, interconnect lines, and PIPs, positioned in the same locations relative to the other logic blocks, interconnect lines, and PIPs within the same copy.

20. The method of claim 16, wherein:
the PLD implementation further comprises two additional copies of the user circuit implemented using the logic blocks, interconnect lines, and PIPs, each additional copy having an output terminal,
the voting circuit has two additional input terminals coupled to the output terminals of the two additional copies of the user circuit via the interconnect lines and PIPs, and
the voting circuit provides a value common to at least four of the voting circuit input terminals at the voting circuit output terminal.

21. The method of claim 16, wherein the PLD is a field programmable gate array (FPGA) programmed by configuration data stored in static RAM memory cells.

22. The method of claim 16, further comprising providing an indicator selecting a high-reliability implementation of the user circuit.

23. The method of claim 16, further comprising providing a target selection indicator selecting a target PLD.

24. The method of claim 23, wherein the target PLD is a field programmable gate array (FPGA) programmed by configuration data stored in static RAM memory cells.

* * * * *